United States Patent
Peled et al.

(10) Patent No.: US 11,861,824 B1
(45) Date of Patent: Jan. 2, 2024

(54) REFERENCE IMAGE GROUPING IN OVERLAY METROLOGY

(71) Applicant: KLA Corporation, Milpitas, CA (US)

(72) Inventors: Einat Peled, Haifa (IL); Naama Cohen, Kiryat Motzkin (IL); Yuval Lamhot, Haifa (IL)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 18/101,369

(22) Filed: Jan. 25, 2023

Related U.S. Application Data

(60) Provisional application No. 63/306,103, filed on Feb. 3, 2022.

(51) Int. Cl.
  *G06K 9/00* (2022.01)
  *G06T 7/00* (2017.01)

(52) U.S. Cl.
  CPC .... *G06T 7/001* (2013.01); *G06T 2207/20021* (2013.01); *G06T 2207/20216* (2013.01)

(58) Field of Classification Search
  CPC ........... G06T 7/001; G06T 2207/20021; G06T 2207/20216
  See application file for complete search history.

(56) References Cited

U.S. PATENT DOCUMENTS

| | | | |
|---|---|---|---|
| 7,317,531 B2 | 1/2008 | Mieher et al. | |
| 9,164,397 B2 | 10/2015 | Manassen et al. | |
| 9,390,492 B2 | 7/2016 | Rotem | |
| 9,909,982 B2 | 3/2018 | Bringoltz et al. | |
| 10,197,389 B2 | 2/2019 | Levinski et al. | |
| 10,699,969 B2 | 6/2020 | Peled et al. | |
| 2004/0169861 A1* | 9/2004 | Mieher | G03F 7/70625 356/400 |
| 2014/0136137 A1* | 5/2014 | Tarshish-Shapir | G01N 21/4788 702/108 |

(Continued)

FOREIGN PATENT DOCUMENTS

| | | |
|---|---|---|
| WO | 2014138741 A1 | 9/2014 |
| WO | 2017044283 A1 | 3/2017 |

OTHER PUBLICATIONS

Adel, et al., "Diffraction order control in overlay metrology—a review of the roadmap options," Proc. of SPIE vol. 6922, 692202-1 (2008).

(Continued)

*Primary Examiner* — Samir A Ahmed
(74) *Attorney, Agent, or Firm* — Suiter Swantz pc llo

(57) ABSTRACT

An overlay metrology system may include a controller for receiving metrology data associated with a plurality of overlay targets on one or more samples; generating a reference metric for at least some of the plurality of overlay targets based on the metrology data, where the reference metric is associated with one or more properties of the respective overlay targets that contributes to overlay error; classifying the plurality of overlay targets into one or more groups based on the reference metrics calculated for the plurality of overlay targets; generating a reference image for at least some of the one or more groups; generating corrected metrology data using the associated reference image for at least some of the one or more groups; and generating overlay measurements for the plurality of overlay targets based on the corrected metrology data.

25 Claims, 12 Drawing Sheets

(56) References Cited

U.S. PATENT DOCUMENTS

| | | | |
|---|---|---|---|
| 2014/0257734 A1* | 9/2014 | Bringoltz | G01N 21/4785 |
| | | | 702/104 |
| 2014/0270469 A1* | 9/2014 | Rotem | G03F 7/70633 |
| | | | 382/145 |
| 2015/0323316 A1* | 11/2015 | Shchegrov | G01B 11/27 |
| | | | 702/150 |
| 2016/0003609 A1* | 1/2016 | Shchegrov | G03F 7/705 |
| | | | 356/625 |
| 2016/0117847 A1* | 4/2016 | Pandev | G06T 7/33 |
| | | | 348/87 |
| 2017/0268869 A1 | 9/2017 | Levinski et al. | |
| 2018/0023950 A1 | 1/2018 | Marciano et al. | |
| 2018/0217508 A1 | 8/2018 | Urbanczyk et al. | |
| 2018/0373167 A1* | 12/2018 | Grunzweig | G03F 7/70683 |
| 2019/0285407 A1* | 9/2019 | Chuang | G03F 7/70625 |
| 2020/0241428 A1 | 7/2020 | Marciano et al. | |
| 2021/0407112 A1 | 12/2021 | Tel et al. | |

OTHER PUBLICATIONS

Korean Intellectual Property Office, International Search Report and Written Opinion for International Application No. PCT/US2023/012163, dated May 26, 2023, 8 pages.

* cited by examiner

REFERENCE IMAGE GROUPING IN OVERLAY METROLOGY

CROSS-REFERENCE TO RELATED APPLICATION

The present application claims the benefit under 35 U.S.C. § 119(e) of U.S. Provisional Application Ser. No. 63/306,103, filed Feb. 3, 2022, naming Einat Peled, Naama Cohen, and Yuval Lamhot as inventors, which is incorporated herein by reference in the entirety.

TECHNICAL FIELD

The present disclosure relates generally to overlay metrology and, more particularly, to mitigating tool-induced errors in overlay metrology.

BACKGROUND

Overlay metrology provides a measurement of a relative registration (or misregistration) between features fabricated using different patterning processes. Some overlay metrology techniques determine an overlay measurement by illumination of a portion of a sample including overlapping features associated with the different patterning processes of interest and collecting data associated with a symmetry of the overlapping features. For example, some scatterometry overlay metrology (SCOL) utilize overlay targets including periodic features associated with different patterning processes on different layers in an overlapping region of a sample. In this configuration, opposing diffraction orders (e.g., +/−1 diffraction orders, +/−2 diffraction orders, or the like) may have a common amplitude when the features of the overlay target are symmetric and may differ in amplitude when features of the overlay target are offset. As a result, an overlay measurement associated with the patterning processes may be determined based on such symmetry data. However, such techniques are sensitive to measurement non-uniformities, which may manifest as errors in the overlay measurement and are commonly referred to as tool induced shift (TIS) errors. There is therefore a need to develop systems and methods to cure the above deficiencies.

SUMMARY

An overlay metrology system is disclosed in accordance with one or more illustrative embodiments. In one illustrative embodiment, the system includes a controller to implement a metrology recipe. In another illustrative embodiment, the controller receives metrology data associated with a plurality of overlay targets on one or more samples. In another illustrative embodiment, the controller generates a reference metric for at least some of the plurality of overlay targets based on the metrology data, where the reference metric is associated with one or more properties of the respective overlay targets that contributes to overlay error. In another illustrative embodiment, the controller classifies the plurality of overlay targets into one or more groups based on the reference metrics calculated for the plurality of overlay targets. In another illustrative embodiment, the controller generates a reference image for at least some of the one or more groups. In another illustrative embodiment, the controller generates corrected metrology data using the associated reference image for at least some of the one or more groups. In another illustrative embodiment, the controller generates overlay measurements for the plurality of overlay targets based on the corrected metrology data.

An overlay metrology system is disclosed in accordance with one or more illustrative embodiments. In one illustrative embodiment, the system includes an optical sub-system. In another illustrative embodiment, the optical sub-system includes one or more optical elements configured to illuminate a sample with light from an illumination source in accordance with a metrology recipe. In another illustrative embodiment, the optical sub-system includes one or more optical elements configured to direct at least a portion of light from the sample to a detector located at a pupil plane. In another illustrative embodiment, the system includes a controller to implement the metrology recipe. In another illustrative embodiment, the controller receives metrology data associated with a plurality of overlay targets on one or more samples. In another illustrative embodiment, the controller generates a reference metric for at least some of the plurality of overlay targets based on the metrology data, where the reference metric is associated with one or more properties of the respective overlay targets that contributes to overlay error. In another illustrative embodiment, the controller classifies the plurality of overlay targets into one or more groups based on the reference metrics calculated for the plurality of overlay targets. In another illustrative embodiment, the controller generates a reference image for at least some of the one or more groups. In another illustrative embodiment, the controller generates corrected metrology data using the associated reference image for at least some of the one or more groups. In another illustrative embodiment, the controller generates overlay measurements for the plurality of overlay targets based on the corrected metrology data.

An overlay method is disclosed in accordance with one or more illustrative embodiments. In one illustrative embodiment, the method includes receiving metrology data associated with a plurality of overlay targets on one or more samples. In another illustrative embodiment, the method includes generating a reference metric for at least some of the plurality of overlay targets based on the metrology data, where the reference metric is associated with one or more properties of the respective overlay targets that contributes to overlay error. In another illustrative embodiment, the method includes classifying the plurality of overlay targets into one or more groups based on the reference metrics calculated for the plurality of overlay targets. In another illustrative embodiment, the method includes generating a reference image for at least some of the one or more groups. In another illustrative embodiment, the method includes generating corrected metrology data using the associated reference image for at least some of the one or more groups. In another illustrative embodiment, the method includes generating overlay measurements for the plurality of overlay targets based on the corrected metrology data.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

DETAILED DESCRIPTION

Figure 1A:
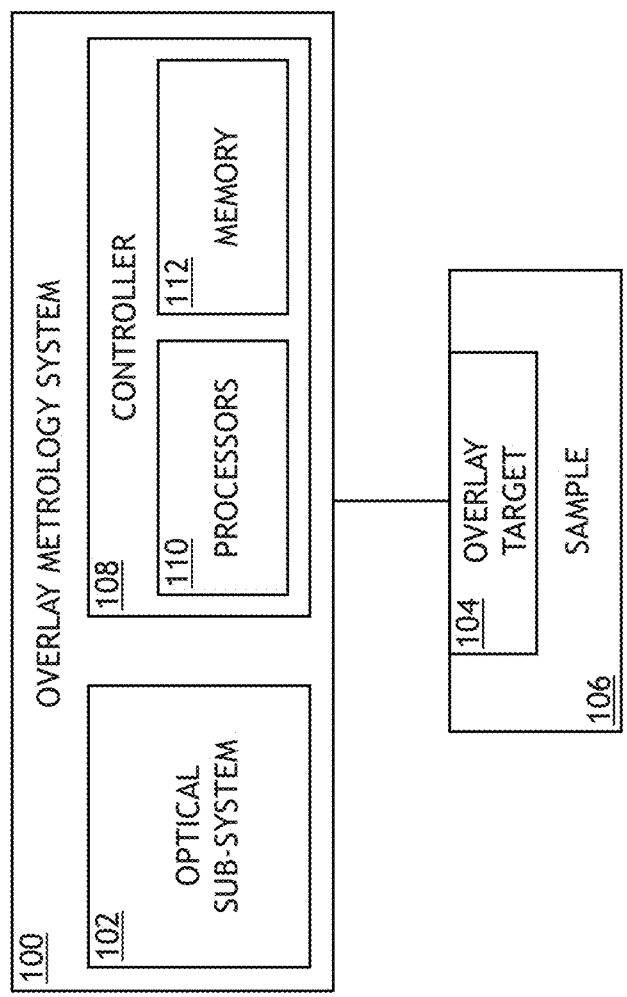
FIG. 1A is a block diagram view of an overlay metrology system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for generating reference images for scatterometry overlay (SCOL) metrology measurements to mitigate tool induced shift (TIS) errors associated with measurement non-uniformities. A reference image may characterize measurement non-uniformities and may be used to at least partially remove the impact of such measurement non-uniformities and the associated TIS errors during a measurement. In embodiments, multiple reference images are generated that may be suitable for different groups of metrology data (e.g., metrology data from different groups of overlay targets). For example, metrology data from various overlay targets across a sample may be grouped based on a metric associated with measurement non-uniformities and different reference images may be generated for each group. Metrology data associated with subsequent measurements of overlay targets on the same or different samples may then be grouped based on the metric for selection of a suitable reference image. As an illustration, one source of measurement non-uniformities may include non-uniformities of printed features that may vary across a sample. As a result, a single reference image may not mitigate the associated TIS errors with the same effectiveness. In some embodiments, multiple reference images are generated and applied to different groups of features.

SCOL measurements are based on metrology data generated by illuminating a portion of a sample having features associated with two patterning processes (e.g., lithoghraphic exposures, etching processes, or the like) and collecting the resulting light from the sample, where the features associated with the different patterning processes may be on the same or different layers of the sample. SCOL techniques may generally utilize overlay targets including one or more cells, though this is not a requirement. As used herein, an overlay target may generally refer to any portion of the sample suitable for an overlay measurement and may include, but is not limited to, dedicated features designed for the purposes of an overlay measurement or device features associated with a device being fabricated. Further, features of an overlay target (referred to herein as target features) may be on any layer or combination of layers of a sample. For example, target features may be located on a photoresist layer. In this case, the features may be characterized by refractive index variations in the photoresist layer induced by a lithographic exposure. As another example, target features may be located on a process layer. In this case, the features may be characterized by variations in material composition induced by etching the sample after patterning with the photoresist or any other patterning process (e.g., direct etching or the like).

It is contemplated herein that TIS errors in SCOL metrology may be attributed to various sources including illumination non-uniformity in an overlay metrology system as well as the particular physical and optical characteristics of sample features being measured. Since process variations may result in slight deviations between properties of overlay targets across the sample, it may be the case that a single reference image may not be sufficient to mitigate TIS errors for metrology targes across the sample.

Embodiments of the present disclosure are directed to systems and methods for classifying metrology data from different metrology targets across a sample into groups (referred to herein as reference groups) and providing different reference images for the different reference groups.

The metrology data from different overlay targets may be separated into different reference groups using any suitable technique. In some embodiments, the reference groups are based on a metric derived from measured or expected process variations across a sample. In some embodiments, the reference groups are based on a metric derived from the metrology data itself. For example, in SCOL measurements based on pupil-plane images, the metric may be a pupil center slope associated with a variation of a determined overlay based on a selection of a pupil center location. As an illustration, some pupil-plane SCOL techniques may determine overlay based on difference signals related to a difference in amplitude between diffraction orders of opposite sign (e.g., +1 and −1 diffraction orders) or opposing pupil coordinates more generally. These difference signals are defined according to a pupil center location such that a determined overlay measurement may vary for different selected pupil center locations. It is contemplated herein that the pupil center slope may be a suitable metric for grouping metrology data from overlay targets across the sample for the purposes of reference image generation. Put another way, a reference image may effectively mitigate TIS errors for overlay targets with similar pupil center slope values. The pupil center slope may thus be an indirect metric of sample variations that may be contribute to TIS errors.

In some embodiments, groupings derived for one sample may be applied to additional samples. Continuing the previous example, pupil center slopes may be determined for metrology data associated with overlay targets on one or more additional samples. Subsequently, this data may be grouped based on the previously-defined bins representing pupil slope ranges and corresponding reference images may be used for overlay determinations.

Additional embodiments of the present disclosure are directed to monitoring the values of the pupil center slope (or any other selected metric) over time across multiple samples as a function of sample location. It is contemplated herein that the variations of the pupil center slope (or any other selected metric) over time across samples at a particular sample location may be indicative of process variations. This information may then be used directly for process control (e.g., for generating correctables for process tools to compensate for such process variations) and/or for adjusting the definitions of the reference groups. For example, it may be the case that reference groups may generally be associated with spatial regions of a sample used to define the reference groups (e.g., radial spatial regions associated with radial process variations). However, if metrology data associated with a particular sample location begins to sort into a different reference group over time, it may be the case that the definitions of the reference groups (e.g., definitions of bins associated with pupil center slope ranges) may need to be updated.

Referring now to FIGS. 1A-8B, systems and methods for grouped reference image generation for overlay metrology is described in greater detail, in accordance with one or more embodiments of the present disclosure.

FIG. 1A is a block diagram view of an overlay metrology system 100, in accordance with one or more embodiments of the present disclosure.

In some embodiments, the overlay metrology system 100 includes an optical sub-system 102 to generate metrology data from an overlay target 104 on a sample 106. In some embodiments, the overlay metrology system 100 further includes a controller 108 with one or more processors 110 configured to execute program instructions maintained on memory 112 (e.g., a memory medium). The controller 108 may be communicatively coupled with any of the components of the overlay metrology system 100 such as, but not limited to the detector 124. In this way, the controller 108 may generate overlay measurements based on the metrology data.

An overlay metrology system 100 may generally be configurable according to one or more metrology recipes. A metrology recipe may include a set of parameters for controlling various aspects of an overlay measurement such as, but not limited to, the illumination of a sample, the collection of light from the sample in the form of metrology data, the position of the sample during a measurement, or processing steps used to generate a measurement based on collected metrology data. In this way, the optical sub-system 102 may be configured to provide a selected type of measurement for a selected overlay target design.

For example, a metrology recipe may include parameters of the illumination beams 114 such as, but not limited to, an illumination wavelength, an illumination pupil distribution (e.g., a distribution of illumination angles and associated intensities of illumination at those angles), a polarization of incident illumination, or a spatial distribution of illumination. As another example, a metrology recipe may include collection parameters such as, but not limited to, a collection pupil distribution (e.g., a desired distribution of angular light from the overlay target 104 to be used for a measurement and associated filtered intensities at those angles), collection field stop settings to select portions of the overlay target 104 of interest, polarization of collected light, wavelength filters, or parameters for controlling one or more detectors. As another example, a metrology recipe may include various parameters associated with a design of the overlay target 104 such as, but not limited to, positions and orientations of sample features (e.g., pitches of grating features along particular directions). As another example, a metrology recipe may include various parameters associated with the position of the sample 106 during a measurement such as, but not limited to, a sample height, a sample orientation, whether a sample is static during a measurement, or whether a sample is in motion during a measurement (along with associated parameters describing the speed, scan pattern, or the like). As another example, a metrology recipe may include various processing steps used to generate a determined overlay measurement (e.g., a specific value of the overlay to be output) based on the metrology data.

In some embodiments, the overlay metrology system 100 operates as a SCOL metrology tool such that the metrology recipe is associated with a SCOL measurement technique.

In a general sense, an overlay target 104 suitable for SCOL measurement techniques (e.g., a SCOL overlay target 104) may include target features for each patterning process of interest that are 180-degree rotationally symmetric and located in overlapping regions of the sample 106. In some embodiments, target features associated with any of the patterning processes are periodic such that they generate discrete diffraction orders from incident illumination. However, this is not a requirement and target features associated with any of the patterning processes need not be periodic.

Figure 2A:
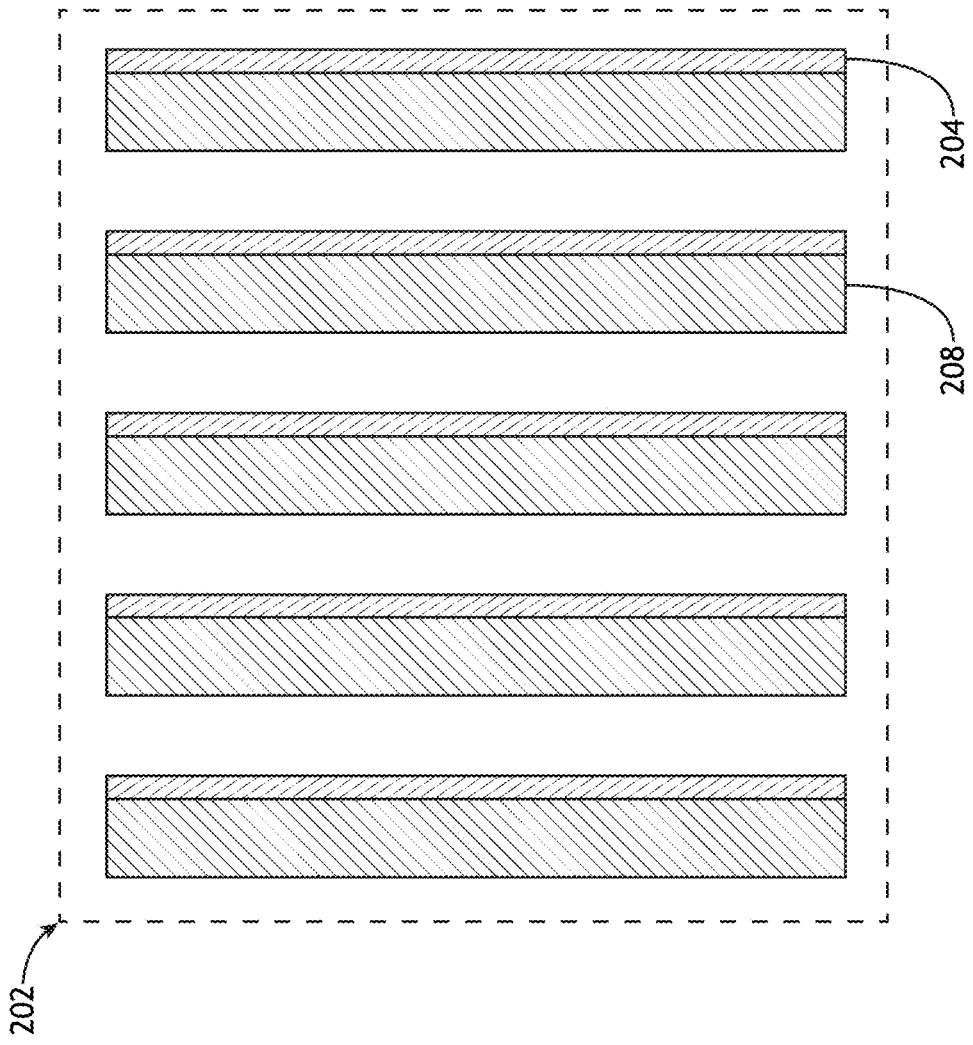
FIG. 2A is a top view of a single cell of an overlay target with periodic features, in accordance with one or more embodiments of the present disclosure.
Figure 2B:
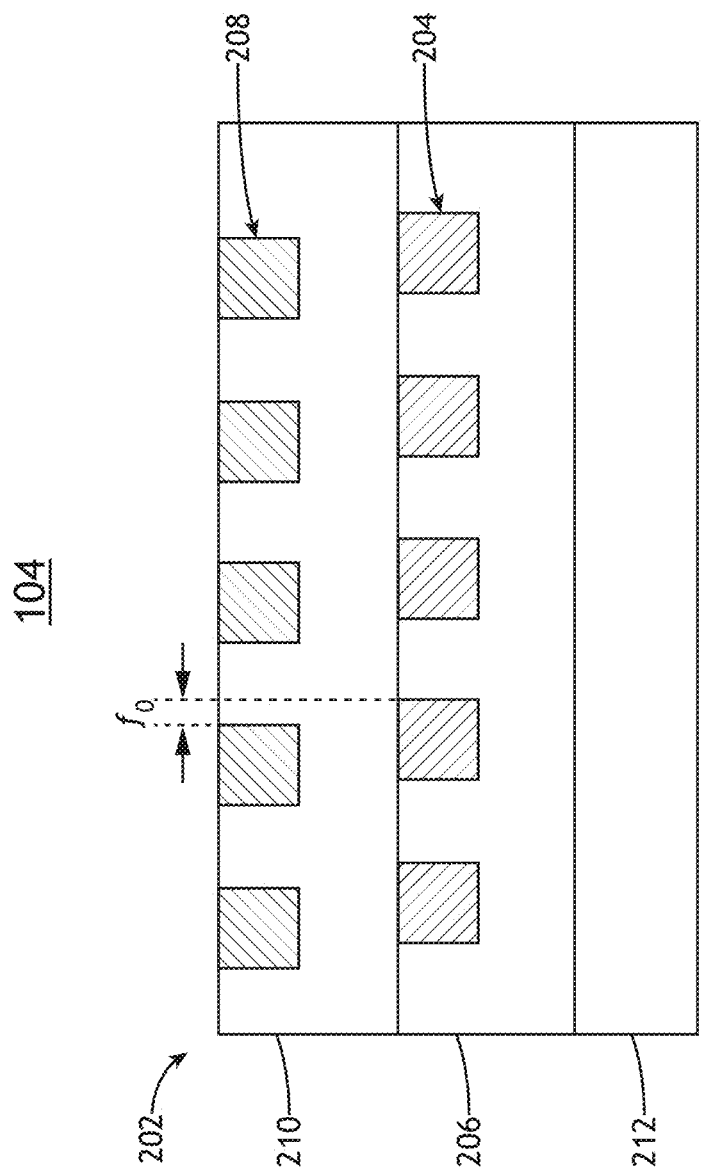
FIG. 2B is a side view of the single cell in FIG. 2A, in accordance with one or more embodiments of the present disclosure.

Referring now to FIGS. 2A-2B, a non-limiting example of a SCOL overlay target 104 is described. In a general sense, an overlay target 104 may include one or more cells 202, each including overlapping target features associated with two or more patterning processes of interest. In some embodiments, an overlay target 104 includes target features dedicated to overlay measurements. In some embodiments, an overlay target 104 includes a region of the sample 106 including device features (e.g., features associated with a device being fabricated on the sample 106).

FIG. 2A is a top view of a single cell 202 of an overlay target 104 with periodic features, in accordance with one or more embodiments of the present disclosure. FIG. 2B is a side view of the single cell 202 in FIG. 2A, in accordance with one or more embodiments of the present disclosure.

In some embodiments, the cell 202 includes first-layer printed elements 204 located on a first layer 206 of the sample 106 and second-layer printed elements 208 located on a second layer 210 of the sample 106 oriented such that the regions including the first-layer printed elements 204 and the second-layer printed elements 208 overlap to form a grating-over-grating structure. FIG. 2B further depicts a substrate 212 beneath the first-layer printed elements 204 and the second-layer printed elements 208.

The first-layer printed elements 204 and the second-layer printed elements 208 in any particular cell 202 may be designed to have any intended offset ($f_0$) along any direction (e.g., the X direction in FIG. 2B corresponding to a measurement direction). For example, an intended offset of zero ($f_0=0$) may provide that the first-layer printed elements 204 and the second-layer printed elements 208 fully overlap when the physical overlay is also zero (e.g., no overlay error). In this configuration, a relative shift between the first-layer printed elements 204 and the second-layer printed elements 208 is indicative of overlay error during fabrication. As another example, a non-zero intended offset ($f_0 \neq 0$) may provide that the first-layer printed elements 204 and the second-layer printed elements 208 exhibit this intended offset when the physical overlay is zero (e.g., no overlay error). An overlay target 104 may generally be formed from any number of cells 202 that may have any combination of intended offsets (e.g., values of $f_0$).

Although not explicitly illustrated, an overlay target 104 may be suitable for overlay measurements along multiple directions (e.g., orthogonal directions). In general, a measurement direction may correspond to direction of periodicity of the first-layer printed elements 204 and the second-layer printed elements 208 (e.g., a direction of periodicity of the grating-over-grating structure). As an illustration, the cell 202 depicted in FIGS. 2A and 2B exhibits periodicity along the X direction and is suitable for overlay measurements along the X direction.

In some embodiments, an overlay target 104 includes one or more cells 202 having periodicity along a first direction (e.g., the X direction as depicted in FIGS. 2A and 2B) and one or more cells having periodicity along a second direction (e.g., the Y direction as depicted in FIGS. 2A and 2B). In some embodiments, an overlay target 104 includes one or more cells 202 having periodicity along two directions simultaneously. For example, the first-layer printed elements 204 and the second-layer printed elements 208 may include structures that are periodic in both the X and Y directions (e.g., a hatch pattern, a grid of square or rectangular structures, or the like).

Referring generally to FIGS. 2A and 2B, it is to be understood that FIGS. 2A and 2B along with the associated descriptions are merely illustrative and should not be interpreted as limiting on the present disclosure. For example, the first layer 206 and the second layer 210 may generally have any thicknesses. As another example, the sample 106 may include any number of layers between the first-layer printed elements 204 and the second-layer printed elements 208 and/or between the first-layer printed elements 204 and the substrate 212. As another example, the first-layer printed elements 204 and the second-layer printed elements 208 may generally include any 180-degree rotationally symmetric features and need not include grating-over-grating or even periodic features.

Various SCOL techniques have been developed to generate an overlay measurement based on metrology data from an overlay target 104. Metrology data for SCOL techniques may generally be generated in a pupil-plane and/or a field plane. For example, a pupil-plane image may capture various diffraction orders from the target features associated with each patterning process. In this configuration, the intensity at any location of the pupil plane may be associated with the interference of diffraction from the target features associated with the different patterning processes. As another example, various field-plane images may be generated based on selected combinations of diffraction orders or light in different parts of a pupil-plane more generally. For instance, the overlay metrology system 100 may include various components to isolate desired diffraction orders for a particular field-plane image.

As an illustration, first-order SCOL techniques may be based on metrology data associated with first-order diffraction from target features associated with different patterning processes. Such techniques may typically require metrology data from two cells 202 having different intended offsets (e.g., $\pm f_0$). In this configuration, an overlay measurement may be determined based on difference signals associated with differences between positive and negative first-order diffraction from each cell (e.g., opposing pupil coordinates more generally). These difference signals may be generated directly in pupil-plane images or based on separate field-plane images of each cell (e.g., one image based on positive first-order diffraction and one based on negative first-order diffraction).

As another illustration, zero-order SCOL techniques may be based on metrology data associated with zero-order light from an overlay target such as, but not limited to, zero-order diffraction or opposite-order diffraction from overlapping target features (e.g., positive first-order diffraction from target features in one layer and negative first-order diffraction from target features in another layer).

Various non-limiting examples of SCOL techniques are generally described in Adel, et al., "Diffraction order control in overlay metrology—a review of the roadmap options," Proc. Of SPIE Vol. 6922, 692202-1 (2008); U.S. Pat. No. 7,317,531 entitled "Apparatus and methods for detecting overlay errors using scatterometry" and issued on Jan. 8, 2008; U.S. Pat. No. 10,197,389 entitled "Approaches in first order scatterometry overlay based on introduction of auxiliary electromagnetic fields" and issued on Feb. 5, 2019; and International Publication Number WO 2017/044283 published on Mar. 16, 2017; all of which are incorporated herein by reference in their entireties.

Referring now to Equations (1)-(8), overlay determinations and the use of reference images to mitigate TIS errors are described in greater detail, in accordance with one or more embodiments of the present disclosure. For the purposes of illustration, first-order SCOL techniques based on pupil-plane images are described. However, it is to be understood that this is not limiting and the concepts described herein may be extended by one of ordinary skill in the art to any SCOL techniques using any combination of pupil-plane metrology data or field-plane metrology data.

In some embodiments, differential signals such as the following may be defined based on metrology data:

$$D^{+f_0} = \frac{I_{+1}^{+f_0} - I_{-1}^{+f_0}}{2} = B \cdot \sin\left(2\pi \frac{OVL + f_0}{P}\right) \quad (1)$$

$$D^{-f_0} = \frac{I_{+1}^{-f_0} - I_{-1}^{-f_0}}{2} = B \cdot \sin\left(2\pi \frac{OVL - f_0}{P}\right). \quad (2)$$

where I is an intensity at a particular location in the pupil plane, the subscripts (+/−1) refer to the diffraction order, and the superscripts ($\pm f_0$) refer to the intended offset of the cell 202 being measured. In this way, $D^{+f_0}$ corresponds to a differential signal generated from a cell 202 with an intended offset of $+f_0$, while $D^{-f_0}$ corresponds to a differential signal generated from a cell 202 with an intended offset of $-f_0$.

It is noted that the overlay target 104 need not include periodic features and thus need not provide discrete diffraction orders. Accordingly, Equations (1) and (2) may be generalized for all pupil coordinates.

Figure 3:
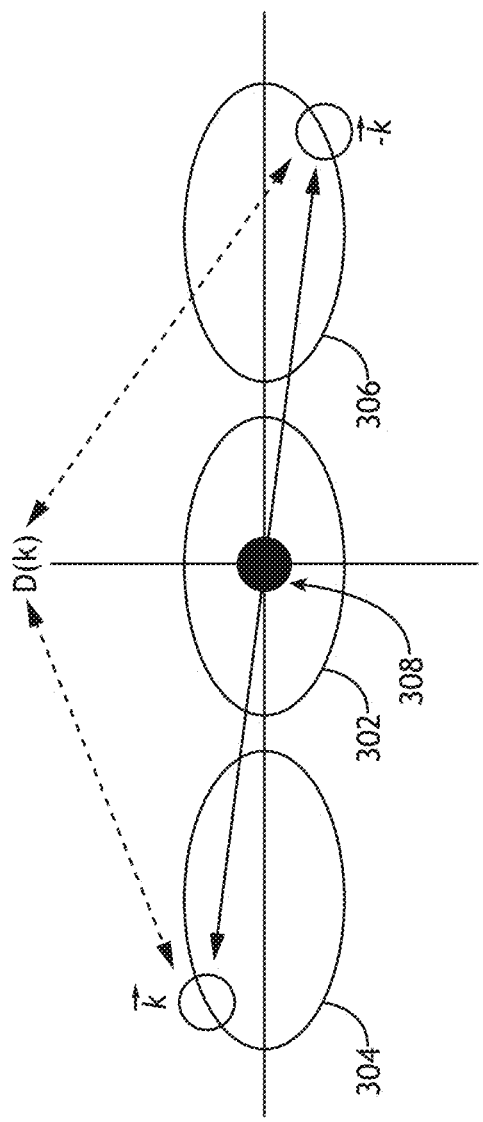
FIG. 3 is a conceptual view of a pupil image illustrating the generation of differential signals, in accordance with one or more embodiments of the present disclosure.

FIG. 3 is a conceptual view of a pupil image (e.g., an image in a collection pupil plane) illustrating the generation of differential signals, in accordance with one or more embodiments of the present disclosure.

In particular, FIG. 3 illustrates 0-order diffraction 302, positive first-order diffraction 304 and negative first-order diffraction 306. This distribution may be generated by illuminating a cell 202 including periodic first-layer printed elements 204 and second-layer printed elements 208 with a single illumination beam at a normal incidence angle.

As depicted in FIG. 3, a differential signal D(k) may correspond to a difference between an intensity at pupil coordinate k and an intensity a pupil coordinate −k, where coordinates k and −k are 180-degree rotationally symmetric about a pupil center position 308. Further, the differential signals may be formed as an average (or a weighted average) of all pupil coordinates.

These differential signals may then be combined into so-called K and G signals:

$$K = \frac{D^{+f_0} + D^{-f_0}}{2} = B\sin\left(2\pi\frac{OVL}{P}\right)\cos\left(2\pi\frac{f_0}{P}\right) \quad (3)$$

$$G = \frac{D^{+f_0} - D^{-f_0}}{2f_0} = B\cos\left(2\pi\frac{OVL}{P}\right)\sin\left(2\pi\frac{f_0}{P}\right) \quad (4)$$

An overlay measurement (OVL) may then be generated as $$OVL = \frac{P}{2\pi}\tan^{-1}\left(\frac{K}{G}\tan\left(2\pi\frac{f_0}{P}\right)\right) \quad (5)$$

as long as G≠0.

Assuming OVL≪P and $f_0$≪P, Equation (3) and (4) indicate that the K signal is dependent on the actual value of the overlay OVL being measured at the location of the overlay target 104, while the G signal is not. Rather, the G signal depends on $$\left(\frac{OVL}{P}\right)^2$$

which is negligible under these conditions. In this case, Equation 5 reduces to $$OVL = \frac{K}{G} \cdot f_0$$

As described previously herein, reference images may be used to at least partially mitigate TIS errors in overlay measurements. TIS errors may be attributable to multiple sources including, but not limited to, non-uniformities of a measurement performed by the optical sub-system 102 (e.g., a non-uniform illumination beam, non-uniformities in an illumination pathway, non-uniformities in a collection pathway, or the like) and/or non-uniformities in the overlay target 104. Such TIS errors may generally be observed from overlay measurements generated with the overlay target 104 in two different orientations with respect to the optical sub-system 102. In particular, the TIS may be characterized as:

$$TIS = \frac{1}{2}(OVL_0 - OVL_{180}), \quad (7)$$

where $OVL_0$ corresponds an overlay measurement of an overlay target 104 with the sample in a first orientation with respect to the optical sub-system 102 and where $OVL_{180}$ corresponds to an overlay measurement of the same overlay target 104 rotated by 180 degrees with respect to the optical sub-system 102.

In this characterization, a TIS-corrected overlay measurement (OVL) independent of TIS may be determined as:

$$OVL = \frac{1}{2}(OVL_0 + OVL_{180}). \quad (8)$$

It is noted that a TIS-corrected overlay measurement as defined by Equation (8) may generally require two measurements of the same overlay target 104 at 180-degree rotations. However, performing such double measurements on each overlay target 104 of interest across a sample may be time consuming and result in a relatively low measurement throughput.

To mitigate the need to measure each overlay target 104 twice at different rotations, a reference image may be generated that may capture relevant non-uniformities. For example, a reference image may be generated based on metrology data captured for an overlay target 104 at two orientations (e.g., 0 and 180 degrees). As an example in the case of an overlay metrology system 100 configured to determine overlay based on pupil images (e.g., images generated by a detector 124 at a pupil plane 138), a reference image may be generated by summing pupil images (e.g., metrology data) generated at 180-degree rotations. Further, a reference image may be symmetrized to prevent noise amplification. For instance, a reference image may be symmetrized by dividing the reference image by an average of the reference image and a 180-degree rotated version of itself. The impact of asymmetries on and calibrations of SCOL measurements are generally described in U.S. Pat. No. 9,909,982 issued Mar. 6, 2018, U.S. Pat. No. 9,164,397 issued on Oct. 20, 2015, and U.S. Pat. No. 9,390,492 issued on Jul. 12, 2016, all of which are incorporated herein by reference in their entireties.

Regardless of how a reference image is generated, the reference image may be used to correct metrology data associated with a single measurement of an overlay target 104 at a single orientation. For example, a pupil image (e.g., the metrology data) may be divided by the reference image to mitigate the impact of TIS errors.

However, the efficacy of a reference image for mitigation of TIS errors is related to how well the reference image captures the measurement non-uniformities that contribute to the TIS errors. It is recognized herein that many previous SCOL techniques have utilized a single reference image for all overlay targets 104 on a sample 106 based on an assumption that the measurement uniformities contributing to TIS errors are primarily due to non-uniformities of illumination and/or collection by the optical sub-system 102. However, it is contemplated herein that sample variations between overlay targets 104 may also contribute to TIS errors such that a single reference image may not accurately mitigate TIS errors for all overlay targets 104.

Figure 4:
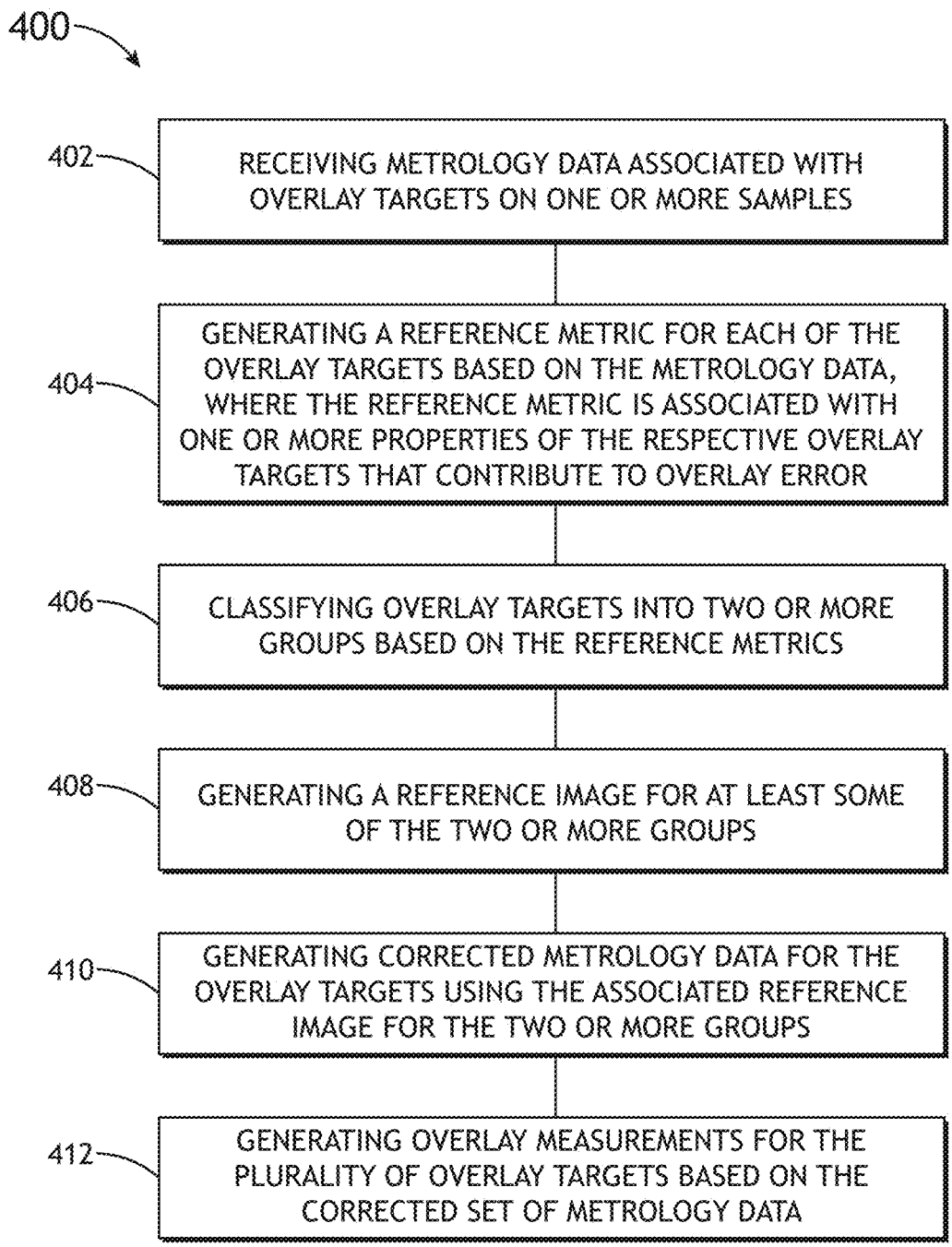
FIG. 4 is a flow diagram illustrating steps performed in a method for generating different reference images for metrology data associated with different groups of overlay targets, in accordance with one or more embodiments of the present disclosure.

FIG. 4 is a flow diagram illustrating steps performed in a method 400 for generating different reference images for metrology data associated with different groups of overlay targets 104, in accordance with one or more embodiments of the present disclosure. Applicant notes that the embodiments and enabling technologies described previously herein in the context of the overlay metrology system 100 should be interpreted to extend to the method 400. It is further noted, however, that the method 400 is not limited to the architecture of the overlay metrology system 100.

In some embodiments, the method 400 includes a step 402 of receiving metrology data associated with overlay targets 104 on one or more samples 106. For example, the metrology data may include any combination of pupil-plane or field-plane images suitable for an overlay measurement using a SCOL technique (e.g., based on a selected metrology recipe). The metrology data generated in step 402 may be associated with all overlay targets 104 or a subset of overlay targets 104 on the one or more samples 106. Further, the metrology data may be associated with overlay measurements along one or more measurement directions.

In some embodiments, the method 400 includes a step 404 of generating a reference metric for each of the overlay targets 104 based on the metrology data, where the reference metric is associated with one or more properties of the respective overlay targets 104 that contribute to overlay error. In some embodiments, the method 400 includes a step 406 of classifying overlay targets 104 into one or more groups based on the reference metrics. In some embodiments, the method 400 includes a step 408 of generating a reference image for at least some of the one or more groups.

In a general sense, the steps 406 and 408 may provide for any number of groups based on the reference metrics. It is contemplated herein that the number of groups may depend on the particular characteristics of each particular sample 106 or samples 106 within a particular lot and that a desired number of groups may not be known a priori. Accordingly, the method 400 may facilitate the analysis of the overlay targets 104 on each sample 106 based on the reference metric (e.g., step 404), the determination of both a suitable number of groups that would benefit from separate reference images (e.g., step 406), and the generation of the associated reference images (e.g., step 408).

As described previously herein, the reference images may be generated using any suitable technique known in the art. In some embodiments, a reference image for a particular group is generated based on metrology data from a single representative overlay target 104 in the group (e.g., metrology data from multiple orientations of the overlay target 104). In some embodiments, a reference image for a particular group is generated based on metrology data from multiple representative overlay targets 104.

The reference metric may include any metric associated with properties of the overlay targets 104 that contribute to overlay error (e.g., TIS error). Such overlay errors may be associated with non-uniformities of the overlay target 104 and may vary based on location on a sample 106. For example, it may be the case that a sample 106 may exhibit process variations with a radial distribution. As an illustration, characteristics such as, but not limited to, film thickness, sidewall angles of fabricated features, or asymmetries of fabricated features may vary with a radial distribution across a sample 106. Further, one or more such process variations may impact overlay measurements such that a single reference image may not be suitable for mitigating TIS errors across the entire sample 106. Accordingly, measurements of one or more such process variations may be used as a basis for separating metrology data into reference groups, each having a different reference image. Process variation detection is generally described in U.S. Pat. No. 10,699,969 issued on Jun. 30, 2020, which is incorporated herein by reference in its entirety.

In some embodiments, the reference metric is based on at least one of a physical measurement, an expected measurement, or a simulation of one or more properties of the overlay targets 104. Such measurements may be performed at locations of the overlay targets 104 or at different locations on the sample 106 and extrapolated to the locations of the overlay targets 104. For example, the reference metric may be based on measurements such as, but not limited to, asymmetry of target features (e.g., the first-layer printed elements 204 and/or second-layer printed elements 208 as depicted in FIGS. 2A-2B), sidewall angle along any direction, critical dimension (CD), or layer thickness (e.g., a thickness of the first layer 206 and/or the second layer 210 as depicted in FIGS. 2A-2B).

In some embodiments, the reference metric is derived from the metrology data itself. In this way, no additional measurements, simulations, or assumptions may be necessary.

Generation of reference metric based on a pupil-plane SCOL techniques is now described, in accordance with one or more embodiments of the present disclosure. However, it is to be understood that this description is provided purely for illustrative purposes and should not be interpreted as limiting. Rather, concepts disclosed herein may be extended to field-plane SCOL techniques by one of ordinary skill in the art.

In some embodiments, the reference metric includes or is based on a pupil center slope measurement generated based on metrology data prior to correction with a reference image, where the pupil center slope may correspond to a variation of a determined overlay measurement based on selection of the pupil center position 308.

As depicted in FIG. 3, an overlay measurement may be determined based on difference signals generated from pupil-plane images of light emanating from an overlay target 104. However, such an approach may be sensitive to the selection of the pupil center position 308.

Figure 5:
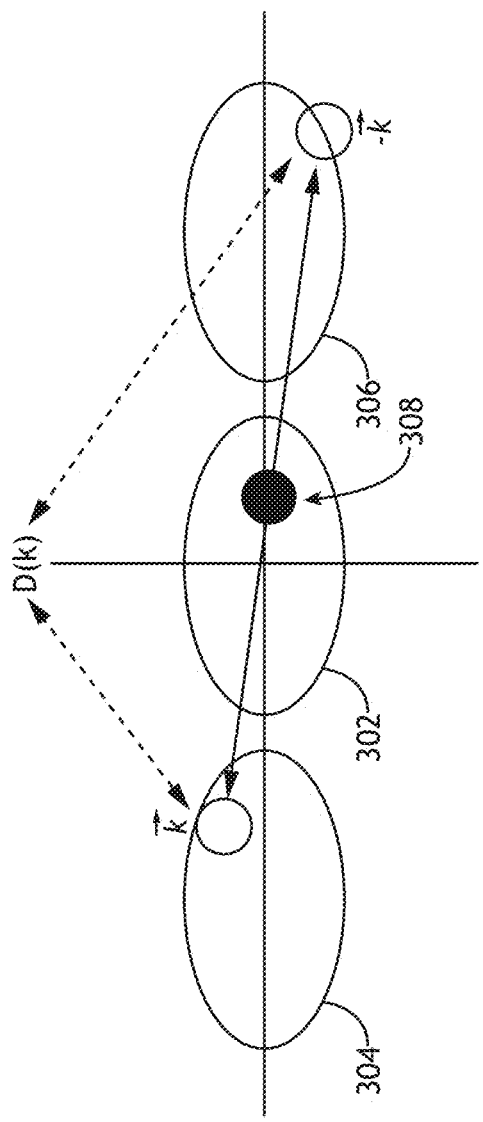
FIG. 5 is a conceptual view of a pupil image illustrating the generation of differential signals with a different pupil center position than in FIG. 3, in accordance with one or more embodiments of the present disclosure.

FIG. 5 is a conceptual view of a pupil image (e.g., an image in a collection pupil plane) illustrating the generation of differential signals with a different pupil center position 308 than in FIG. 3, in accordance with one or more embodiments of the present disclosure. As shown in FIG. 5, opposing pupil coordinates are defined by the pupil center position 308. As a result, differential signals and a resulting overlay determination may be influenced by the selection of the pupil center position 308. Additionally, the selection of the pupil center position 308 may impact the TIS error associated with a measurement as will be described in greater detail below.

The relationship between the pupil center slope ($PC_{slope}$), a resulting overlay measurement, and TIS may be described by Equations (9)-(11), which share common variables and definitions as Equations (7) and (8):

$$OVL_0 = OVL + \Delta p \cdot PC_{slope} \quad (9)$$

$$OVL_{180} = OVL - \Delta p \cdot PC_{slope} \quad (10)$$

$$TIS = \Delta p \cdot PC_{slope} \quad (11)$$

where $\Delta p$ corresponds to a pupil center shift from a reference position (e.g., an arbitrary position) and may have a unit of pixels as measured by a pupil-plane image (e.g., metrology data).

Figure 6:
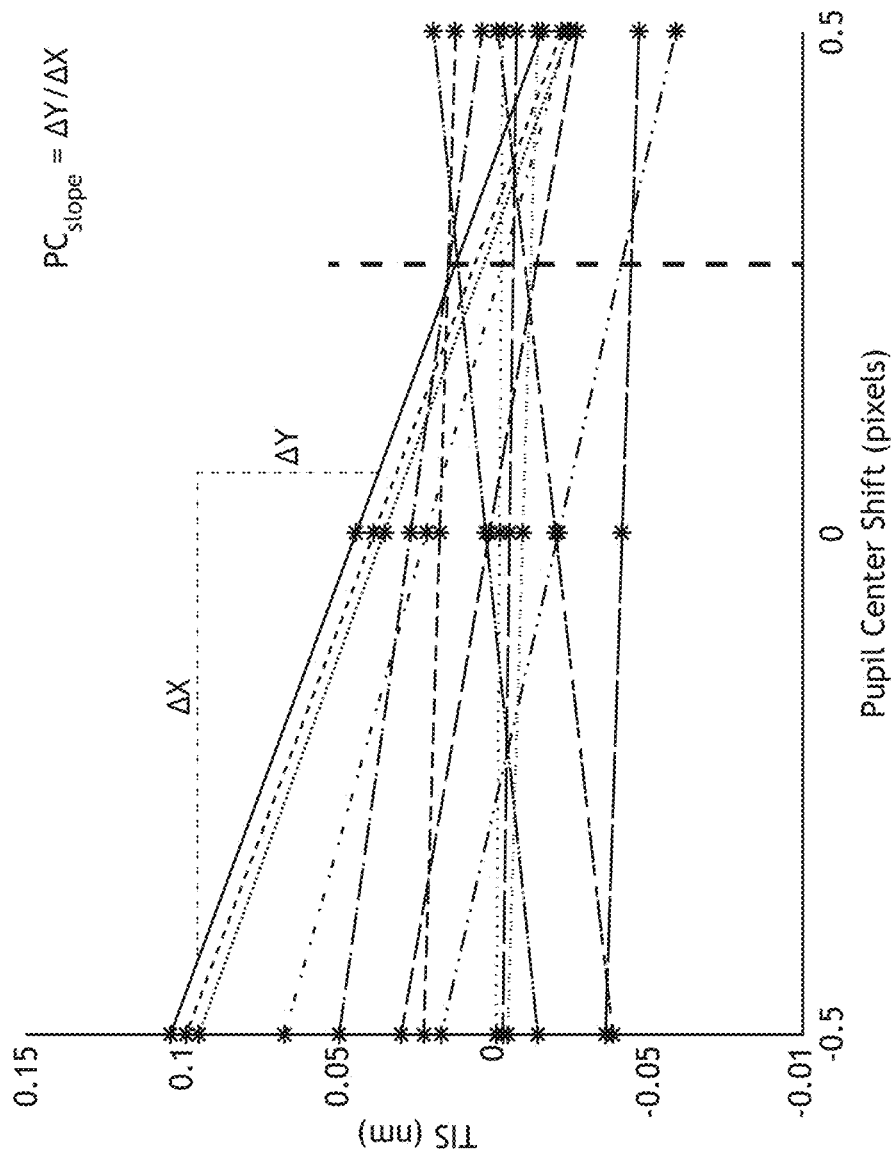
FIG. 6 is a plot of TIS as a function of pupil center shift for several overlay targets illustrating the relationship between the pupil center position, TIS, and the pupil center slope for different overlay targets, in accordance with one or more embodiments of the present disclosure.

FIG. 6 is a plot of TIS as a function of pupil center shift (Δp) for several overlay targets 104 illustrating the relationship between the pupil center position 308, TIS, and the pupil center slope ($PC_{slope}$) for different overlay targets 104, in accordance with one or more embodiments of the present disclosure. For example, the TIS may generally vary approximately linearly with the selection of the pupil center position 308 (e.g., with the pupil center shift), where the pupil center slope ($PC_{slope}$) corresponds to a slope of this linear relationship. However, metrology data for different overlay targets 104 may exhibit different values of the pupil center slope ($PC_{slope}$) and may further have different linear constants affecting a value at which the TIS is minimized (e.g., zero).

Although not explicitly shown, similar plots may be constructed relating a determined overlay value at a given orientation (e.g., $OVL_0$, $OVL_{180}$, or the like) to the pupil center position 308 (or pupil center shift as shown in FIG. 6).

It is noted that typical pupil-plane based SCOL techniques may select the pupil center position 308 in various ways. For example, the pupil center position 308 may be selected to minimize TIS for all measured samples. This technique is illustrated in FIG. 6 by a dashed line 602 indicating a selection of the pupil center shift (and associated pupil center position 308) that seeks to optimize both a minimal average TIS and 3σ variation across the measured overlay targets 104. Pupil center optimization techniques are also generally described in International Patent Publication No. 2014/138741 published on Sep. 12, 2014, which is incorporated herein by reference in its entirety.

Figure 7A:
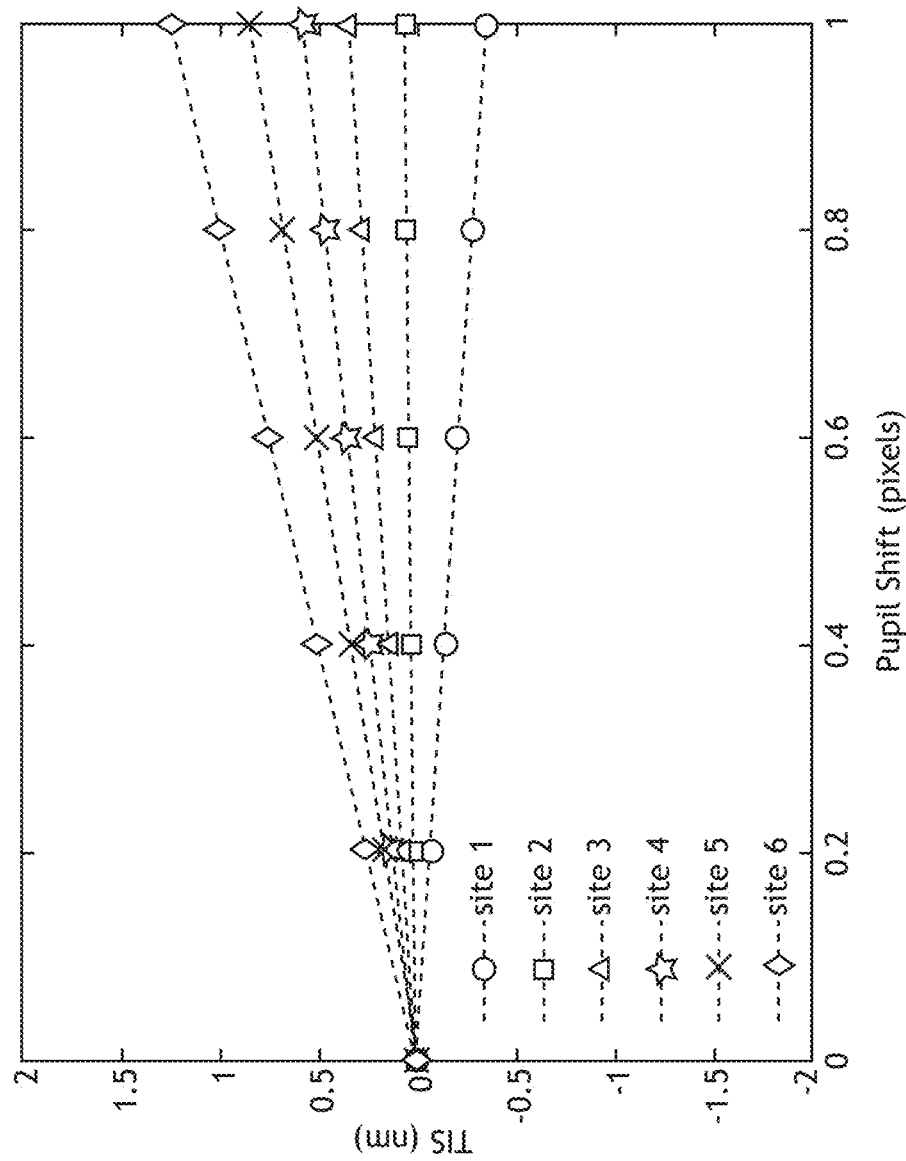
FIG. 7A is a plot of TIS as a function of pupil center shift based on metrology data from multiple overlay targets that are not corrected with a reference image, in accordance with one or more embodiments of the present disclosure.

It is contemplated herein that the pupil center slope ($PC_{slope}$) is a metric that characterizes properties of the sample 106 at a location of an overlay target 104 and is independent of the particular optical sub-system 102 used to generate the associated metrology data. In particular, the simulations and SCOL theory indicate that the pupil center slope relates to the thickness of a measured layer (e.g., as illustrated in FIG. 7A). As a result, the pupil center slope is well suited to operate as a reference metric for grouping overlay targets having similar physical properties based solely on metrology data (e.g., pupil-plane images of an overlay target 104) without requiring additional measurements.

Further, when a reference image is generated based on metrology data from a particular overlay target 104 (e.g., based on metrology data from the particular overlay target 104 from two orientations rotated 180 degrees from each other), the pupil center slope ($PC_{slope}$) calculated based on the corrected metrology data may be approximately zero (at least over a suitable range of locations of the pupil center position 308). As a result, the TIS at this location also approaches zero or a constant (e.g., as illustrated by Equations (9)-(11) and FIGS. 3, 5, and 6).

Figure 7B:
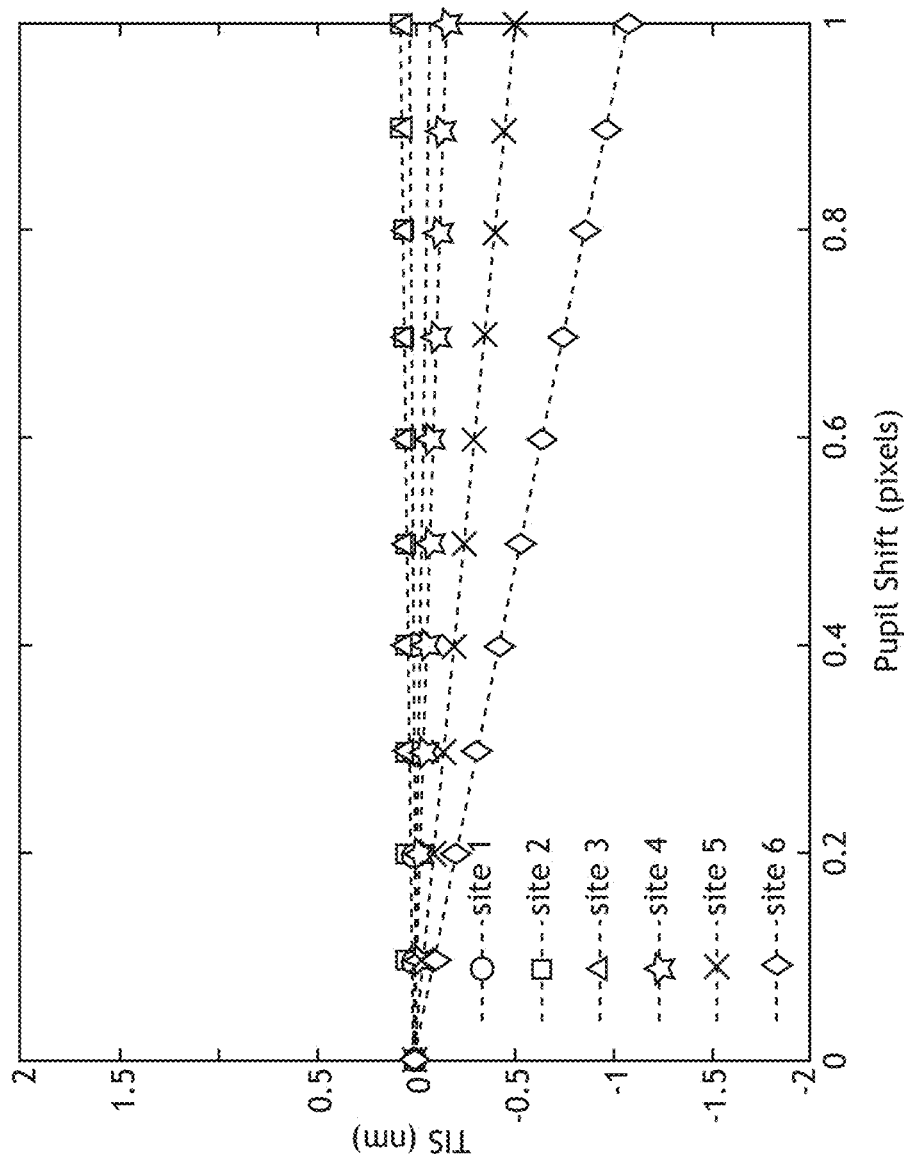
FIG. 7B is a plot of TIS as a function of pupil center shift based on metrology data from multiple overlay targets that are corrected with a reference image generated based on metrology data from a particular one of the overlay targets, in accordance with one or more embodiments of the present disclosure.

FIGS. 7A and 7B illustrate simulations of the impact of the selection of a reference image on the TIS of multiple overlay targets 104, in accordance with one or more embodiments of the present disclosure. In particular, FIGS. 7A and 7B are based on simulations with overlay targets 104 in locations of different layer thickness. FIG. 7A is a plot of TIS as a function of pupil center shift based on simulated metrology data from multiple overlay targets 104 that are not corrected with a reference image, in accordance with one or more embodiments of the present disclosure. In FIG. 7A, each overlay target 104 (represented by a site on the sample 106) has a different pupil center slope ($PC_{slope}$) indicating varying physical characteristics of the associated overlay targets 104. FIG. 7B is a plot of TIS as a function of pupil center shift based on simulated metrology data from multiple overlay targets 104 that are corrected with a reference image generated based on simulated metrology data from a particular one of the overlay targets 104, in accordance with one or more embodiments of the present disclosure. In particular, the reference image used to generate FIG. 7B was generated based on metrology data from an overlay target 104 at site 3. In FIG. 7B, the corrected pupil center slope (and the TIS) are approximately zero for the range of pupil center shifts considered. Further, overlay targets 104 having metrology data with similar values of the pupil center slope prior to correction with the reference image (as depicted in FIG. 7A) are also well-corrected by the same reference image as indicated by similarly low values of the corrected pupil center slope and TIS. However, overlay targets 104 having metrology data with substantially different values of the pupil center slope prior to correction with the reference image (as depicted in FIG. 7A) are not as well-corrected by the reference image as indicated by relatively high corrected pupil center slope and TIS values in FIG. 7B.

It is thus contemplated herein that a reference image may characterize the interaction of an optical sub-system 102 with a measured overlay target 104 (or location of a measured overlay target 104) in addition to the non-uniformities of the optical sub-system 102 alone. Since the characteristics of overlay targets 104 may vary across different locations of a sample 106 due to factors such as, but not limited to, reflectivity variations (which may require different illumination intensities per site) or other imperfections in the measurements or associated calculations, the efficacy of a particular reference image at mitigating TIS may vary across a sample 106 or with process variations more generally.

However, TIS may be reduced for multiple overlay targets 104 with varying characteristics by first grouping (e.g., in step 406) the metrology data from the overlay targets 104 into one or more groups based on the values of the pupil center slope (e.g., as measured prior to correction by any reference image) followed by generating reference images for each group based on metrology data for overlay targets 104 within the respective groups (e.g., in step 408). As illustrated by Equations (9)-(11) and FIGS. 3, 5, and 6, the value of the pupil center slope may be generated based on determined overlay measurements (e.g., $OVL_0$ measurements) or by calculated TIS values (e.g., associated with both $OVL_0$ and $OVL_{180}$ measurements). However, the use of overlay measurements from a single set of metrology data (e.g., $OVL_0$ measurements) may be faster and thus desirable in some applications.

Referring again to FIG. 4 more generally, the step 406 of classifying metrology data from overlay targets 104 into groups based on a reference metric (e.g., pupil center slope or any other suitable metric) may be performed in various ways within the spirit and scope of the present disclosure.

In some embodiments, a range of values of the reference metric observed in the metrology data from the overlay targets 104 may be divided into any number of bins representative of the one or more groups. In this way, metrology data associated with a particular overlay target 104 may be classified based on the corresponding bin containing the value of the calculated reference metric for this overlay target 104.

In a general sense, any number of groups and associated reference images may be generated. However, since the generation of reference images requires metrology data at two sample orientations (e.g., a 0 degree orientation and a 180 degree orientation), a large number of groups and their associated reference images will require more data collection at multiple sample orientations. In this case, there is tradeoff between achieving minimal TIS (by having a large number of groups) and faster measurements of the entire sample (by having a smaller number of groups).

Figure 8A:
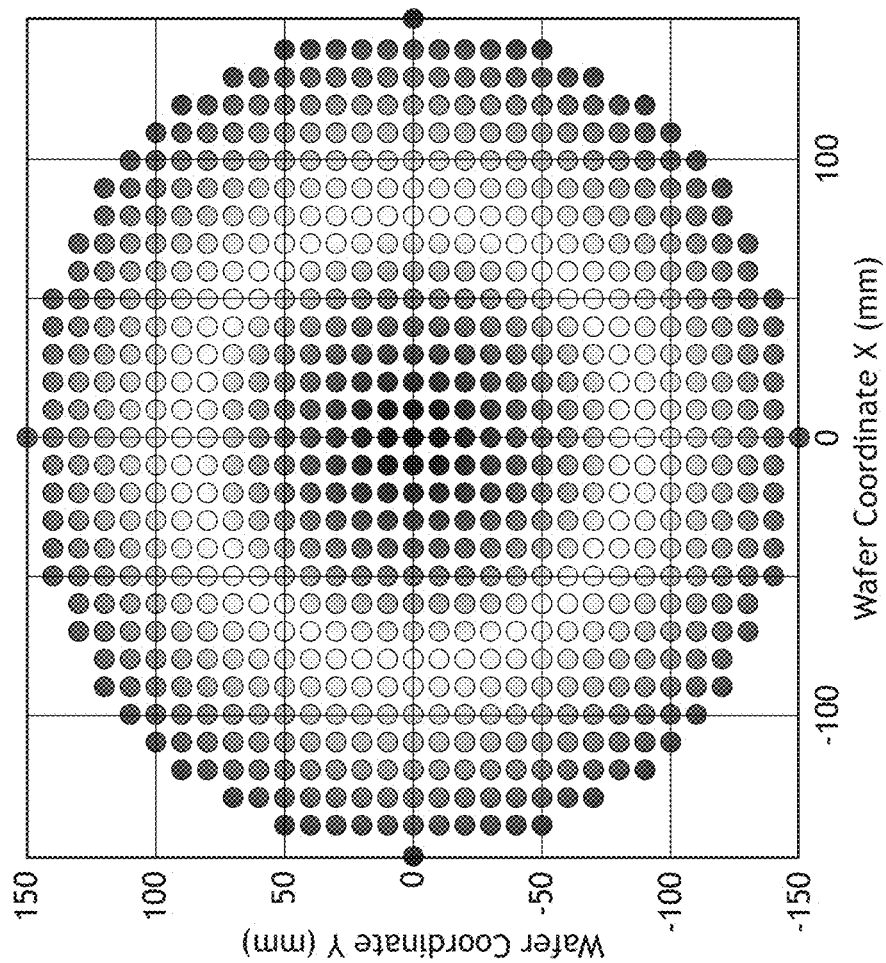
FIG. 8A is a plot illustrating a map of pupil center slope for overlay targets across a sample, in accordance with one or more embodiments of the present disclosure.
Figure 8B:
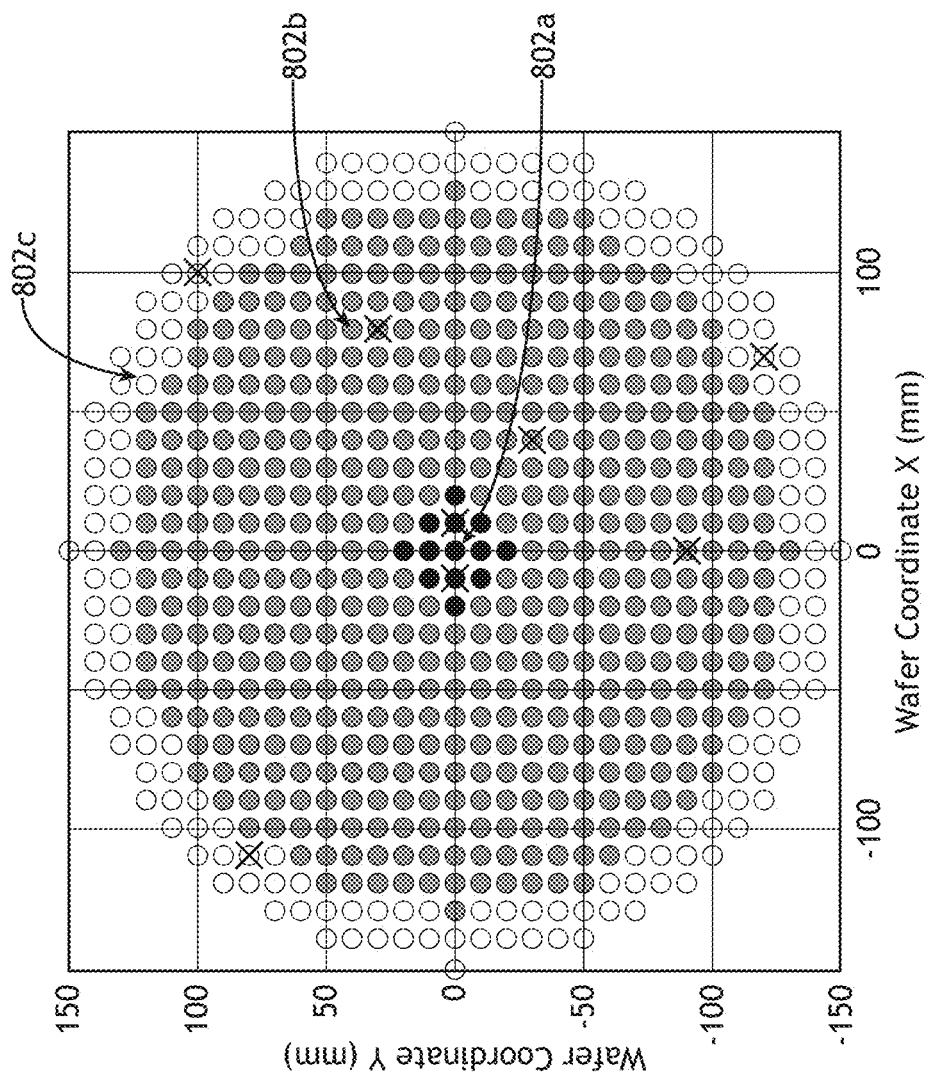
FIG. 8B is a plot illustrating a map of the groups into which the overlay targets are classified, in accordance with one or more embodiments of the present disclosure.

FIGS. 8A and 8B depict the classification of metrology data from overlay targets 104 across the sample into three groups. FIG. 8A is a plot illustrating a map of pupil center slope (e.g., a selected reference metric) for overlay targets 104 across a sample 106, in accordance with one or more embodiments of the present disclosure. In FIG. 8A, the reference metric exhibits a clear radial pattern. As described previously herein, such a pattern may be associated with a radial layer thickness pattern across the sample 106. However, it is to be understood that FIG. 8A is merely illustrative and that the reference metric may have any distribution across a sample 106.

FIG. 8B is a plot illustrating a map of the groups into which the overlay targets 104 are classified (e.g., based on step 406), in accordance with one or more embodiments of the present disclosure. As shown in FIG. 8B, the groups may encompass spatial regions of the sample 106 having similar values of the reference metric. In this particular example, a first group 802a includes a central region of the sample, a second group 802b includes an intermediate radial region, and a third group 802c includes an edge region of the sample 106. It is to be understood, however, that the groupings need not necessarily be continuous on the sample 106. For example, several disparate regions of a sample 106 may fall into a common group.

Referring again to FIG. 4, additional steps of the method 400 are now described, in accordance with one or more embodiments of the present disclosure.

In some embodiments, the method 400 includes a step 410 of generating corrected metrology data for the overlay targets 104 using the associated reference image for the one or more groups (e.g., at least the overlay targets 104 in groups for which a reference image was generated). In some cases, all measured overlay targets 104 are classified into groups (e.g., in step 406) and reference images are generated for each of the groups (e.g., in step 408). In some embodiments, the method 400 includes a step 412 of generating overlay measurements for the plurality of overlay targets based on the corrected set of metrology data. In this way, the provided overlay measurements associated with each overlay target 104 may be well-corrected for errors such as, but not limited to TIS based on appropriate selection of reference images.

It is further contemplated herein that the reference groups and associated reference images are applied to additional overlay targets 104 on the same or different samples 106.

In some embodiments, a set of overlay targets 104 used to classify reference groups and generate associated reference images is only a sub-set of overlay targets 104 on a sample 106 (e.g., as defined by a metrology recipe). In this case, metrology data generated for overlay target 104 not in this original set may simply be classified based on the existing groups. As an illustration in the case of classification based on bins or ranges of the reference metric, values of the reference metric may be generated for additional overlay targets 104 (e.g., in a corollary to step 404) such that the additional overlay targets 104 may be classified into a group based on the associated bin or range of the reference metric (e.g., in a corollary to step 406). Subsequently, the associated reference image for the group may be used to generate a corrected overlay measurement for each of the additional overlay targets 104 (e.g., in a corollary to step 410 and step 412).

Similarly, the reference groups and associated reference images are applied to additional overlay targets 104 on additional samples 106. In this case, values of the reference metric may be determined for the additional overlay targets 104 on the additional samples 106 for classification based on the existing groups. Subsequently, the associated reference image for the group may be used to generate a corrected overlay measurement for each of the additional overlay targets 104. It is noted that the metrology data associated with additional overlay targets 104 may be classified based on the reference metric and need not necessarily be classified into the same group as neighboring overlay targets 104 or overlay targets 104 in the same location on previous samples 106. In this way, the most suitable reference image may be used for each overlay target 104.

It is further contemplated herein that the reference groups as defined at one point in time may need to be updated. For example, it may be the case that one or more fabrication processes drift sufficiently over time that the efficacy of one or more reference images for the associated groups may decrease.

In a general sense, the method 400 or portions thereof (e.g., step 406 related to the definition of ranges of the reference metric that correspond to the any of groups and/or step 408 related to generation of associated reference images for any of the groups) may be repeated or updated using any technique.

In some embodiments, the method 400 or portions thereof may be performed at periodic intervals. In some embodiments, the method 400 or portions thereof may be performed upon a trigger condition. Any suitable trigger condition may be used. For example, one non-limiting example of a trigger condition may be a number of times that an overlay target 104 at a particular location on a sample 106 is classified into a different group than for an original sample 106 (either an absolute number or a number of times in a selected time window). For example, it may be expected that overlay targets 104 at a particular location of samples 106 should have relatively consistent physical parameters and thus relatively consistent reference metrics. Under this assumption, variations of a reference metric associated with a particular location over time may indicate sample-to-sample process variations. At some point, such sample-to-sample variations may render the reference image for one or more groups ineffective (e.g., TIS errors above a selected threshold value may be present). However, updating the classifications of the groups (e.g., ranges of the reference metric associated with any of the groups) and/or the reference images for any of the groups may again provide effective TIS error correction for all overlay targets 104.

Referring again to FIGS. 1A and 1B, additional aspects of the overlay metrology system 100 are described in greater detail, in accordance with one or more embodiments of the present disclosure.

The one or more processors 110 of a controller 108 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 110 may include any device configured to execute algorithms and/or instructions (e.g., program instructions stored in memory). In one embodiment, the one or more processors 110 may be embodied as a desktop computer, mainframe computer system, workstation, image computer, parallel processor, networked computer, or any other computer system configured to execute a program configured to operate or operate in conjunction with the overlay metrology system 100, as described throughout the present disclosure Moreover, different subsystems of the overlay metrology system 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller 108 or, alternatively, multiple controllers. Additionally, the controller 108 may include one or more controllers housed in a common housing or within multiple housings. In this way, any controller or combination of controllers may be separately packaged as a module suitable for integration into the overlay metrology system 100.

The memory 112 may include any storage medium known in the art suitable for storing program instructions executable by the associated one or more processors 110. For example, the memory 112 may include a non-transitory memory medium. By way of another example, the memory 112 may include, but is not limited to, a read-only memory (ROM), a random-access memory (RAM), a magnetic or optical memory device (e.g., disk), a magnetic tape, a solid-state drive and the like. It is further noted that memory 112 may be housed in a common controller housing with the one or more processors 110. In one embodiment, the memory 112 may be located remotely with respect to the physical location of the one or more processors 110 and controller 108. For instance, the one or more processors 110 of controller 108 may access a remote memory (e.g., server), accessible through a network (e.g., internet, intranet and the like).

Figure 1B:
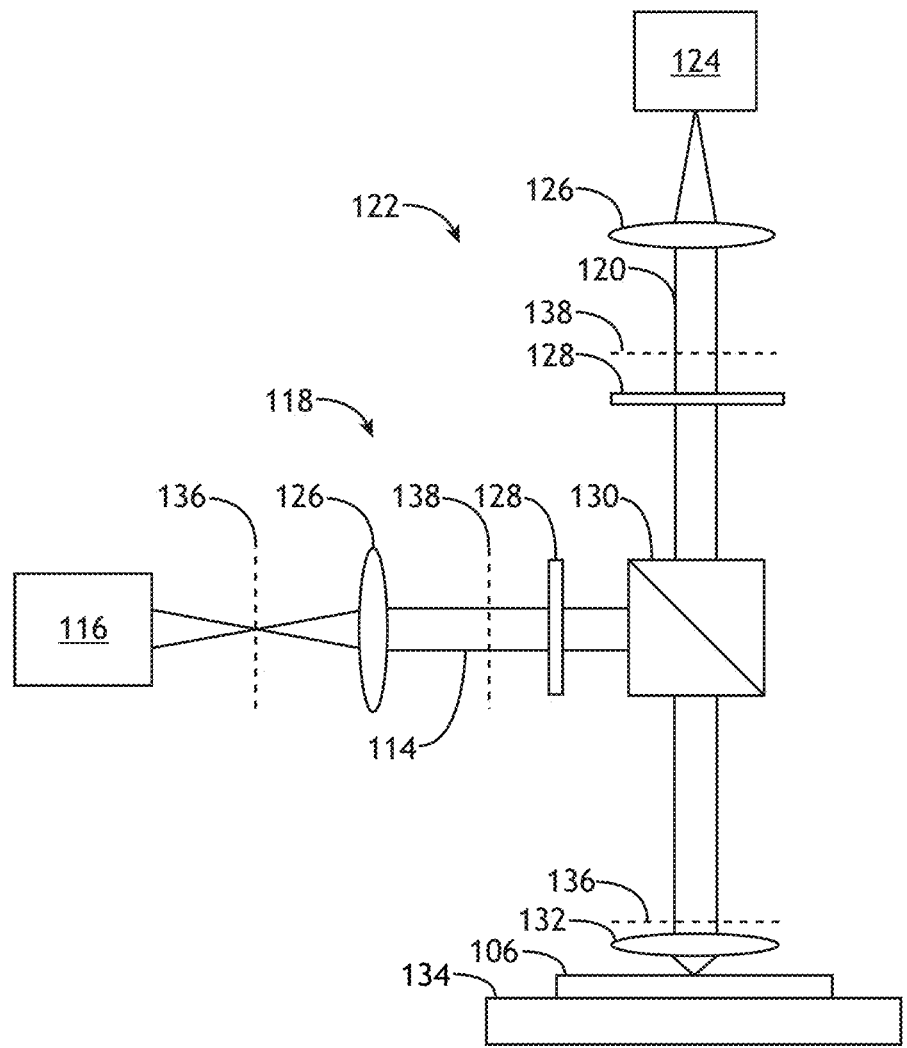
FIG. 1B is a simplified schematic of the optical subsystem, in accordance with one or more embodiments of the present disclosure.

FIG. 1B is a simplified schematic of the optical sub-system 102, in accordance with one or more embodiments of the present disclosure.

In embodiments, the optical sub-system 102, is configurable according to a metrology recipe (e.g., an overlay recipe) to generate an overlay measurement associated with an overlay target 104 having a design based on the metrology recipe. For example, the optical sub-system 102 may direct one or more illumination beams 114 from an illumination source 116 to an overlay target 104 on the sample 106 (e.g., via an illumination pathway 118), collect light or other radiation emanating from the overlay target 104 in response to the (referred to herein as measurement light 120) (e.g., via a collection pathway 122), and generate metrology data from at least one detector 124 based on the measurement light 120. For example, metrology data may be associated with diffraction of the illumination beams 114 from the overlay target 104. The illumination pathway 118 and the collection pathway 122 may further include additional optical elements such as, but not limited to, lenses 126 and beam manipulation components 128 (e.g., polarizers, spectral filters, spatial filters, beam blockers, apertures, or the like) at any suitable locations. In some embodiments, as illustrated in FIG. 1B, the optical sub-system 102 includes one or more beamsplitters 130 to allow simultaneous illumination and collection through a common objective lens 132 or other focusing element. In some embodiments, the optical sub-system 102 includes a translation stage 134 including any number of linear or rotational actuators to secure and/or position the sample 106.

The optical sub-system 102 may include one or more detectors 124 at any suitable locations for the collection of metrology data. For example, the optical sub-system 102 may include at least one detector 124 at a field plane 136 (e.g., a plane conjugate to the sample 106), which is illustrated in FIG. 1B. As another example, though not illustrated, the optical sub-system 102 may include at least one detector 124 at a pupil plane 138 (e.g., a diffraction plane corresponding to an angular distribution of light from the sample 106). Further, although not illustrated, the optical sub-system 102 may include multiple channels, each having a separate detector 124. In this way, the optical sub-system 102 may provide multiple simultaneous measurements using multiple detectors 124 at any combination of field planes 136 or pupil planes 138. For example, the optical sub-system 102 may include one or more beamsplitters (e.g., non-polarizing beamsplitters, polarizing beamsplitters, dichroic mirrors providing spectral selectivity, or the like) to split the measurement light 120 into the different channels for detection. The optical sub-system 102 may further include optical components to modify the properties of the measurement light 120 within each channel such as, but not limited to, polarizers, polarization rotators, spectral filters, spatial filters, or pupil filters (e.g., beam blocks or apertures in a pupil plane to block or pass selected diffraction orders).

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An overlay metrology system, comprising:
    a controller including one or more processors configured to execute program instructions causing the one or more processors to implement a metrology recipe by:

receiving metrology data associated with a plurality of overlay targets on one or more samples;

generating a reference metric for at least some of the plurality of overlay targets based on the metrology data, wherein the reference metric for a particular one of the plurality of overlay targets is associated with one or more properties of the particular one of the plurality of overlay targets that contributes to overlay error;

classifying the plurality of overlay targets into one or more groups based on the reference metrics calculated for the plurality of overlay targets;

generating a reference image for at least some of the one or more groups;

generating corrected metrology data using the associated reference image for at least some of the one or more groups; and generating overlay measurements for the plurality of overlay targets based on the corrected metrology data.

2. The overlay metrology system of claim 1, wherein the one or more groups comprise:

two or more groups.

3. The overlay metrology system of claim 1, wherein the metrology data comprises:

pupil-plane images.

4. The overlay metrology system of claim 3, wherein the reference metric comprises:

a pupil center slope.

5. The overlay metrology system of claim 3, wherein generating the reference metric for at least some of the plurality of overlay targets based on the metrology data comprises:

calculating preliminary overlay values for at least some of the plurality of overlay targets using different values of a selected pupil center location based on the metrology data; and calculating the reference metric based on a relationship between the selected pupil center location and the preliminary overlay values.

6. The overlay metrology system of claim 1, wherein the metrology data comprises:

field-plane images.

7. The overlay metrology system of claim 1, wherein generating the reference metric for at least some of the plurality of overlay targets based on the metrology data comprises:

performing at least one of a measurement or a simulation of one or more characteristics of at least one of the sample or the associated overlay target at locations of at least some of the plurality of overlay targets; and generating the reference metric based on the at least one of the measurement or the simulation.

8. The overlay metrology system of claim 7, wherein the one or more characteristics comprise:

a layer thickness.

9. The overlay metrology system of claim 7, wherein the one or more characteristics comprise:

at least one of a sidewall angle, an asymmetry of one or more fabricated features, or a critical dimension.

10. The overlay metrology system of claim 1, wherein classifying the plurality of overlay targets into one or more groups based on the reference metrics calculated for the plurality of overlay targets comprises:

dividing a range of the reference metrics calculated for the plurality of overlay targets into one or more bins; and classifying the plurality of overlay targets into one or more groups based on the one or more bins.

11. The overlay metrology system of claim 1, wherein the metrology data comprises first metrology data, wherein generating the reference image for a particular group of the one or more groups comprises:

selecting one or more representative overlay targets from the plurality of overlay targets for the particular group;

receiving second metrology data associated with the representative overlay targets, wherein the second metrology data is generated with the representative overlay targets being rotated by 180 degrees relative to the corresponding data from the first metrology data; and generating the reference image for the particular group based on the second metrology data and the corresponding data from the first metrology data.

12. The overlay metrology system of claim 11, wherein generating the reference image for the particular group based on the second metrology data and corresponding data from the first metrology data comprises:

summing images from the second metrology data and the corresponding images from the first metrology data to generate the reference image for the particular group.

13. The overlay metrology system of claim 11, wherein generating the reference image for the particular group based on the second metrology data and corresponding portions of the first metrology data comprises:

summing images from the second metrology data and corresponding images from the first metrology data to generate a first reference image for the particular group; and generating a second reference image for the particular group by rotating the first reference image for the particular group by 180 degrees; and dividing the first reference image for the particular group by an average of the first and second reference images for the particular group to generate the corresponding reference image.

14. The overlay metrology system of claim 1, wherein generating corrected metrology data using the associated reference image for at least some of the one or more groups comprises:

dividing images in first metrology data by the corresponding reference images associated with the one or more groups.

15. The overlay metrology system of claim 1, wherein the one or more program instructions are further configured to cause the one or more processors to implement the metrology recipe by:

receiving additional metrology data associated with a plurality of additional overlay targets;

generating the reference metric for at least some of the plurality of additional overlay targets based on the additional metrology data;

classifying the plurality of additional overlay targets into one or more groups based on the reference metrics calculated for the plurality of additional overlay targets;

generating additional corrected metrology data using the associated reference image for at least some of the one or more groups; and generating overlay measurements for the plurality of additional overlay targets based on the additional corrected metrology data.

16. The overlay metrology system of claim 15, wherein at least one of the one or more additional overlay targets is located on the one or more additional samples.

17. The overlay metrology system of claim 15, wherein at least one of the one or more additional overlay targets is located on the one or more samples.

18. The overlay metrology system of claim 17, wherein the one or more program instructions are further configured to cause the one or more processors to implement the metrology recipe by:
monitoring values of the reference metric associated with one or more locations for the one or more additional samples; and
when a selected condition based on the monitored values of the reference metric is met:
classifying overlay targets of a current sample into a new set of one or more groups based on the reference metric; and
generating reference images for the new set of one or more groups.

19. The overlay metrology system of claim 17, wherein the one or more program instructions are further configured to cause the one or more processors to implement the metrology recipe by:
monitoring values of the reference metric associated with one or more locations for the one or more additional samples; and
generating new reference images for the one or more groups when a selected condition based on the monitored values of the reference metric is met.

20. The overlay metrology system of claim 1, wherein the plurality of overlay targets at least some include one or more cells with overlapping structures associated with two or more patterning processes.

21. An overlay metrology system, comprising:
an optical sub-system comprising:
one or more optical elements configured to illuminate a sample with light from an illumination source in accordance with a metrology recipe; and
one or more optical elements configured to direct at least a portion of light from the sample to a detector located at a pupil plane;
a controller communicatively coupled to the optical sub-system, wherein the controller includes one or more processors configured to execute program instructions causing the one or more processors to implement the metrology recipe by:
receiving metrology data associated with a plurality of overlay targets on one or more samples from the optical sub-system;
generating a reference metric for at least some of the plurality of overlay targets based on the metrology data, wherein the reference metric is associated with one or more properties of the respective overlay targets that contributes to overlay error;
classifying the plurality of overlay targets into one or more groups based on the reference metrics calculated for the plurality of overlay targets;
generating a reference image for at least some of the one or more groups;
generating corrected metrology data using the associated reference image for at least some of the one or more groups; and
generating overlay measurements for the plurality of overlay targets based on the corrected metrology data.

22. An overlay metrology method, comprising:
receiving metrology data associated with a plurality of overlay targets on one or more samples;
generating a reference metric for at least some of the plurality of overlay targets based on the metrology data, wherein the reference metric is associated with one or more properties of the respective overlay targets that contributes to overlay error;
classifying the plurality of overlay targets into one or more groups based on the reference metrics calculated for the plurality of overlay targets;
generating a reference image for at least some of the one or more groups;
generating corrected metrology data using the associated reference image for at least some of the one or more groups; and
generating overlay measurements for the plurality of overlay targets based on the corrected metrology data.

23. The method of claim 22, further comprising:
receiving additional metrology data associated with a plurality of additional overlay targets;
generating the reference metric for at least some of the plurality of additional overlay targets based on the additional metrology data;
classifying the plurality of additional overlay targets into one or more groups based on the reference metrics calculated for the plurality of additional overlay targets;
generating additional corrected metrology data using the associated reference image for at least some of the one or more groups; and
generating overlay measurements for the plurality of additional overlay targets based on the additional corrected metrology data.

24. The method of claim 23, further comprising:
monitoring values of the reference metric associated with one or more locations for the one or more additional samples; and
when a selected condition based on the monitored values of the reference metric is met:
classifying overlay targets of a current sample into a new set of one or more groups based on the reference metric; and
generating reference images for the new set of one or more groups.

25. The method of claim 23, further comprising:
monitoring values of the reference metric associated with one or more locations for the one or more additional samples; and
generating new reference images for the one or more groups when a selected condition based on the monitored values of the reference metric is met.

* * * * *